United States Patent
Mohammad et al.

(10) Patent No.: US 9,785,601 B2
(45) Date of Patent: Oct. 10, 2017

(54) SYSTEM AND METHOD FOR REDUCING CROSS COUPLING EFFECTS

(71) Applicant: QUALCOMM Incorporated, San Diego, CA (US)

(72) Inventors: Baker S. Mohammad, Austin, TX (US); Paul D. Bassett, Austin, TX (US); Martin Saint-Laurent, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/045,282

(22) Filed: Feb. 17, 2016

(65) Prior Publication Data

US 2016/0162432 A1   Jun. 9, 2016

Related U.S. Application Data

(62) Division of application No. 13/242,469, filed on Sep. 23, 2011, now abandoned.

(51) Int. Cl.
*H03H 11/26* (2006.01)
*G06F 13/40* (2006.01)
(Continued)

(52) U.S. Cl.
CPC ...... *G06F 13/4077* (2013.01); *G06F 13/4072* (2013.01); *G06F 13/4291* (2013.01);
(Continued)

(58) Field of Classification Search
USPC ........................................ 327/270
See application file for complete search history.

(56) References Cited

U.S. PATENT DOCUMENTS

| | | |
|---|---|---|
| 4,321,492 A | 3/1982 | Hollingsworth |
| 4,393,315 A | 7/1983 | Stickel et al. |

(Continued)

FOREIGN PATENT DOCUMENTS

| | | |
|---|---|---|
| CN | 1491416 A | 4/2004 |
| CN | 101610039 A | 12/2009 |

(Continued)

OTHER PUBLICATIONS

Ghoneima Maged et al., "Utilizing the Effect of Relative Delay on Energy Dissipation in Low-Power On-Chip Buses," IEEE Transactions on Very Large Scale Integration (VLSI) Systems, vol. 12, No. 12, Dec. 2004, pp. 1348-1359.

(Continued)

*Primary Examiner* — Lincoln Donovan
*Assistant Examiner* — Patrick Chen
(74) *Attorney, Agent, or Firm* — Qualcomm Incorporated

(57) ABSTRACT

A device includes a first driver circuit coupled to a first bus line, where the first driver circuit includes a first delay element. The first delay element is configured to receive a first input signal and generate a first output signal. The first output signal transitions logic levels after a first delay period when the first input signal transitions from a logic high level to a logic low level. The first output signal transitions logic levels after a second delay period when the first input signal transitions from the logic low level to the logic high level. The first delay element includes a sense amplifier. The first driver circuit is configured to transmit the first output signal over the first bus line. The device also includes a second driver circuit configured to transmit a second output signal over a second bus line.

27 Claims, 10 Drawing Sheets

(51) Int. Cl.
*H03K 3/356* (2006.01)
*G06F 13/42* (2006.01)
*H03K 5/15* (2006.01)

(52) U.S. Cl.
CPC . *H03K 3/356069* (2013.01); *H03K 3/356113* (2013.01); *H03K 5/15* (2013.01); *Y02B 60/1228* (2013.01); *Y02B 60/1235* (2013.01)

(56) References Cited

U.S. PATENT DOCUMENTS

| | | | |
|---|---|---|---|
| 4,779,013 A | | 10/1988 | Tanaka |
| 5,519,344 A | * | 5/1996 | Proebsting ........... G11C 7/1051 326/17 |
| 5,608,687 A | | 3/1997 | Komarek et al. |
| 5,936,429 A | | 8/1999 | Tomita |
| 6,087,870 A | | 7/2000 | Sakamoto |
| 6,253,359 B1 | | 6/2001 | Cano et al. |
| 6,316,979 B1 | | 11/2001 | Keeth |
| 6,489,809 B2 | | 12/2002 | Kiehl |
| 6,600,336 B2 | | 7/2003 | Kojima |
| 6,756,816 B2 | | 6/2004 | Miyake |
| 6,992,603 B2 | | 1/2006 | Ghoneima et al. |
| 7,190,286 B2 | | 3/2007 | Ghoneima et al. |
| 7,411,439 B2 | | 8/2008 | Brox et al. |
| 7,469,391 B2 | | 12/2008 | Carrere et al. |
| 7,542,848 B2 | | 6/2009 | Ho |
| 7,639,044 B2 | | 12/2009 | Ito et al. |
| 7,813,211 B2 | | 10/2010 | Kim et al. |
| 8,274,311 B2 | | 9/2012 | Liu |
| 2002/0122346 A1 | | 9/2002 | Blodgett |
| 2003/0117185 A1 | | 6/2003 | Ishibashi et al. |
| 2003/0227296 A1 | | 12/2003 | Lee |
| 2004/0243871 A1 | | 12/2004 | Nieuwland et al. |
| 2006/0200716 A1 | | 9/2006 | Carpenter et al. |
| 2006/0290401 A1 | | 12/2006 | Yanagigawa et al. |
| 2007/0046330 A1 | | 3/2007 | Forbes |
| 2007/0070797 A1 | * | 3/2007 | Song .................... G06F 13/4045 365/233.1 |
| 2008/0240170 A1 | | 10/2008 | Elmala et al. |
| 2009/0119037 A1 | | 5/2009 | Khalil et al. |
| 2009/0121797 A1 | | 5/2009 | Karabatsos |
| 2010/0030924 A1 | | 2/2010 | Shankar et al. |
| 2010/0037028 A1 | | 2/2010 | Shen et al. |
| 2013/0076424 A1 | | 3/2013 | Mohammad et al. |

FOREIGN PATENT DOCUMENTS

| | | |
|---|---|---|
| JP | 10187093 | 7/1998 |
| JP | H10187093 A | 7/1998 |
| JP | 2002231890 A | 8/2002 |
| JP | 2003195992 A | 7/2003 |
| JP | 2004241930 A | 8/2004 |
| JP | 2004526351 A | 8/2004 |
| JP | 2006352741 A | 12/2006 |
| JP | 2009296119 A | 12/2009 |
| JP | 2011017869 A | 1/2011 |
| WO | 02063629 A1 | 8/2002 |

OTHER PUBLICATIONS

International Search Report and Written Opinion—PCT/US2012/056954—ISA/EPO—Jan. 22, 2013.

* cited by examiner

SYSTEM AND METHOD FOR REDUCING CROSS COUPLING EFFECTS

CROSS REFERENCE TO RELATED APPLICATIONS

The present application claims priority from and is a divisional application of U.S. patent application Ser. No. 13/242,469 filed Sep. 23, 2011, entitled "SYSTEM AND METHOD FOR REDUCING CROSS COUPLING EFFECTS," the content of which is incorporated by reference herein in its entirety.

II. FIELD

The present disclosure is generally related to reducing cross coupling effects.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

As electronic devices such as wireless telephones become smaller, there may be a tradeoff between scaling technology and power dissipation of on-chip buses in the electronic devices. A substantial portion of the power dissipated by bus lines (e.g., wires) may be due to coupling capacitance between the bus lines (e.g., when the bus lines are adjacent). The energy to charge the coupling capacitance may change due to relative switching activity between the bus lines. For example, when signals on two adjacent bus lines switch in the same direction at the same time, the voltage difference between the bus lines, and thus the energy to charge the coupling capacitance, may be about zero. However, when the signal on one bus line switches while the signal on the other bus line remains the same, the voltage change may be V and the energy to charge the coupling capacitance may be equal to $\frac{1}{2} C_c V^2$ Joules, where $C_c$ is the effective capacitance between the bus lines and V is the voltage amplitude. Moreover, when the signals on the bus lines switch in opposite directions at the same time, the voltage change may be doubled (i.e. 2V) and the energy to switch the coupling capacitance may be equal to $\frac{1}{2} C_c (2V)^2 = 2 C_c V^2$ Joules.

Various techniques have been proposed for reducing power dissipated by adjacent bus lines. One technique involves shielding bus lines. However, this may not effectively address the increased power dissipation because line to line capacitance may still occur at supply nodes of the bus lines. Another technique is to increase spacing between bus lines. However, increasing the spacing between bus lines may result in an unacceptable increase in die area. Logical shielding has also been proposed. In logical shielding, adjacent signals that switch in opposite directions may be re-routed based on logical constraints. However, it may be difficult to locate logically mutually exclusive signals.

IV. SUMMARY

Systems and methods are disclosed that slow down (e.g., by increasing a switching delay) a rising edge of a switching signal (i.e., producing a delayed low-to-high transition) and speed up (e.g., by reducing a switching delay) a falling edge of a switching signal (i.e., producing a high-to-low transition), or vice versa, on proximately close bus lines. A driver circuit may be coupled to one or more such adjacent or proximately close bus lines, where the driver circuit implements a first delay and a second delay. The first delay may be in response to a high-to-low transition (e.g., in response to a signal transition from a logical '1' to a logical '0') and the second delay may be in response to a low-to-high transition (e.g., in response to a signal transition from a logical '0' to a logical '1'). The first and second delays may be chosen such that the difference between the first and second delays is sufficient to reduce power related to transmission of signals over the adjacent bus lines. By varying signal switching delays on adjacent bus lines, the energy dissipation due to the switching may be reduced. The driver circuits may include a delay element that implements the first and second delay. For example, the delay element may be a sense amplifier.

In a particular embodiment, a device may include a plurality of driver circuits coupled to a plurality of bus lines. A first driver circuit of the plurality of driver circuits may be coupled to a first bus line of the plurality of bus lines. The first driver circuit may include a delay element configured to produce an output signal. The output signal may transition after a first delay in response to a first digital value transition of an input signal from high to low and may transition after a second delay in response to a second digital value transition of the input signal from low to high. The first delay may be different from the second delay by an amount sufficient to reduce power related to transmission of signals over the first bus line and over a second bus line in close physical proximity to the first bus line. For example, the delay element may prevent signals on the first and second bus lines from switching at the same time, potentially reducing the energy required to switch the bus lines. The delay element may include a sense amplifier. In addition, a second driver circuit including the delay element may be coupled to the second bus line the second bus line may also include the delay element). Further, in a particular illustrative implementation, all of the plurality driver circuits coupled to the plurality of bus lines may include the delay element.

In another particular embodiment, a method may include receiving a first input signal at a delay element coupled to a first bus line of a plurality of bus lines. The first input signal has a first digital value transition from high to low. The method further includes generating a first output signal at the delay element in response to the first input signal, where the first output signal transitions after a first delay. The method further includes receiving a second input signal at the delay element. The second input signal has a second digital value transition from low to high. The method further includes generating a second output signal at the delay element, where the second output signal transitions after a second delay. The delay element is configured to produce the output signal which transitions after the first delay in response to the first digital value transition of the input signal from high to low and transitions after the second delay in response to the second digital value transition of the input signal from low to high. The first delay may be different from the second delay by an amount sufficient to reduce power related to transmission of signals over the first bus line and over a second bus line in close physical proximity to the first bus line. For example, the delay element may prevent signals on the first and second bus lines from switching at the same time, potentially reducing the energy required to switch the bus lines. The delay element may include a sense amplifier.

In another particular embodiment, an apparatus includes means for delaying an output signal at a first bus line of a plurality of bus lines based on a digital value transition of an input signal at the first bus line. The output signal transitions after a first delay in response to a first digital value transition of the input signal from high to low and transitions after a second delay in response to a second digital value transition of the input signal from low to high. The first delay is different from the second delay by an amount sufficient to reduce power related to transmission of signals over the first bus line and over a second bus line in close physical proximity to the first bus line. The means for delaying comprises a sense amplifier.

One particular advantage provided by at least one of the disclosed embodiments is a decrease in power dissipation due to cross coupling at adjacent bus lines or bus lines in close proximity. Another particular advantage provided by at least one of the disclosed embodiments is an increase in battery life of an electronic device due to the decrease in power dissipation.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
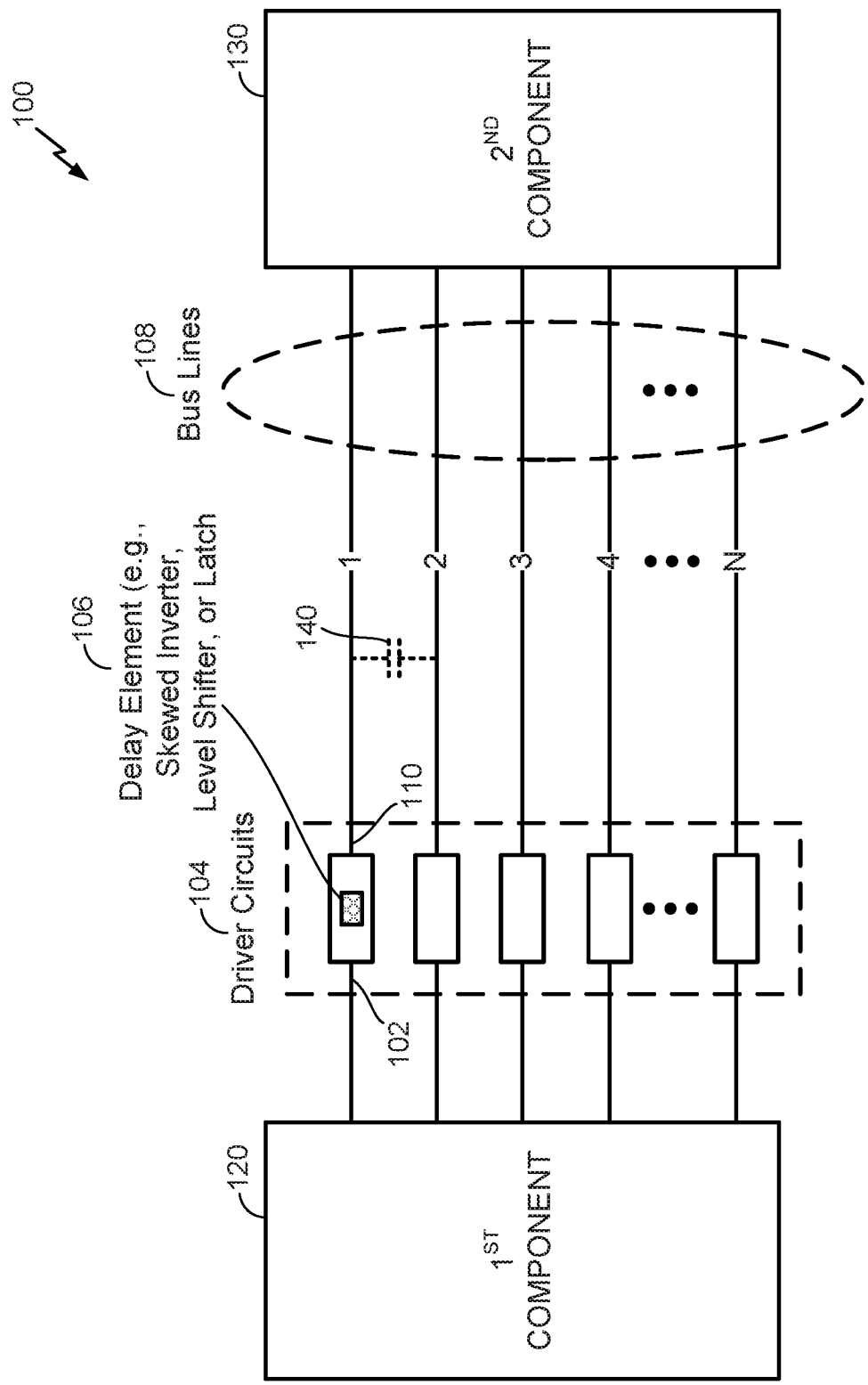
FIG. 1 is a block diagram of a particular illustrative embodiment of a system to reduce cross coupling effects on bus lines.

Referring to FIG. 1, a particular illustrative embodiment of a system to reduce cross coupling effects on bus lines is disclosed and generally designated 100. The system 100 includes a first component 120 coupled to a second component 130 via a plurality of bus lines 108. Each of the bus lines 108 may be coupled to one of a plurality of driver circuits 104.

In an illustrative embodiment, the first component 120 and the second component 130 are hardware components that are integrated into an electronic device, such as a wireless telephone. For example, the first component 120 and the second component 130 may include components of the electronic device described with reference to FIG. 10.

Figure 3:
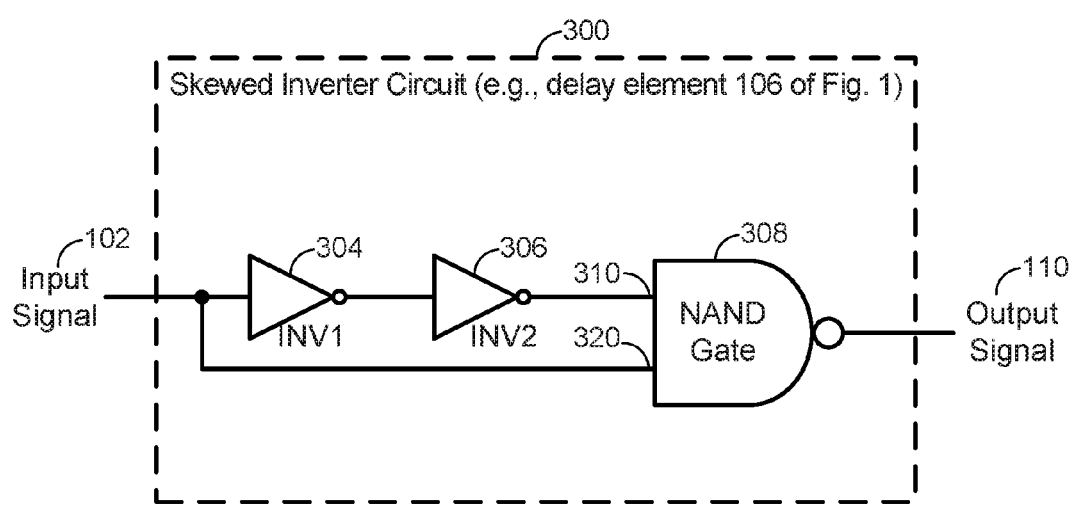
FIG. 3 is a diagram of a particular illustrative embodiment of a skewed inverter circuit that implements the delay element of FIG. 1.
Figure 4:
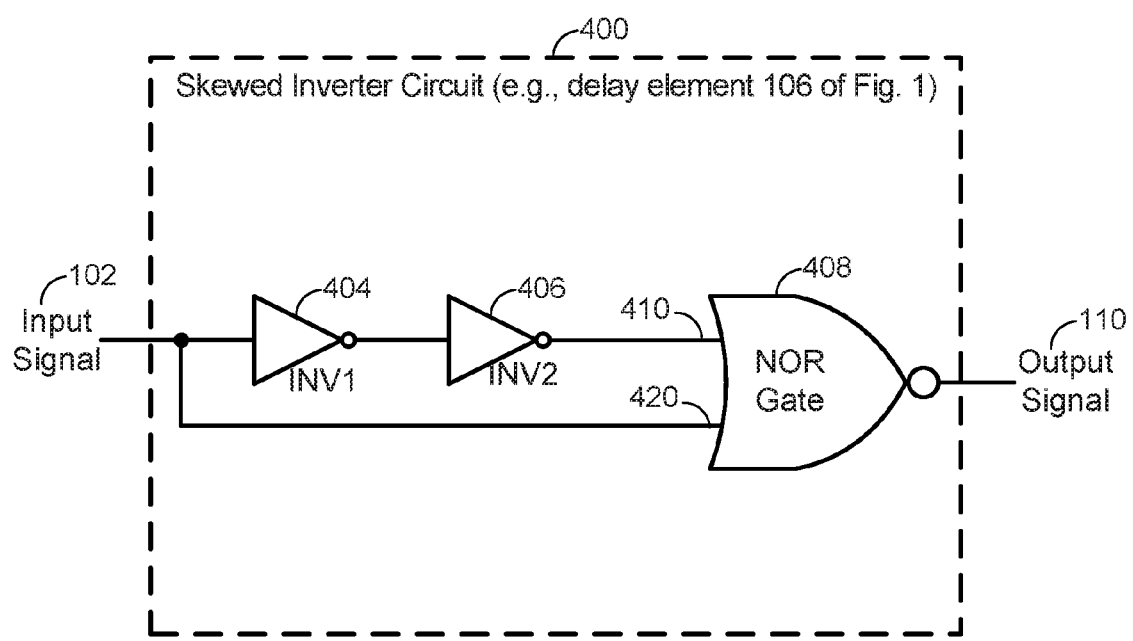
FIG. 4 is a diagram of another particular illustrative embodiment of a skewed inverter circuit that implements the delay element of FIG. 1.

A first driver circuit of the plurality of driver circuits 104 may be coupled to a first bus line (designated "1" in FIG. 1) of the plurality of bus lines 108. The first driver circuit may include a delay element 106, receive an input signal 102, and produce an output signal 110. The input signal 102 may be differential or single-ended. The delay element 106 may include one of a skewed inverter, a level shifter, a latch, and a sense amplifier. Depending on the delay element 106, the input signal 102 and the output signal 110 may have the same logical value (e.g., may both be logical '1' or both be logical '0') or may have opposite logical values (e.g., one may be a logical '0' and the other a logical '1'). For example, if the delay element 106 includes a skewed inverter circuit (e.g., as illustrated in FIGS. 3-4), the output signal 110 may be the inverse of the input signal 102. In a particular embodiment, the delay element 106 may also receive a clock signal (not shown) and may produce the output signal 110 in response to a transition in the clock signal (e.g., as further described with reference to the latch of FIG. 7). The delay element 106 may be configured to produce the output signal 110 such that the output signal 110 transitions after a first delay in response to a first digital value transition of the input signal 102 from high to low and transitions after a second delay in response to a second digital value transition of the input signal 102 from low to high. For example, the delay element 106 may have a delay in a transitioning from a logical "0" to a logical "1" that is different than a delay in transitioning from a logical "1" to a logical "0." The first delay may be different from the second delay by an amount sufficient to reduce power related to transmission of signals over the first bus line and over a second bus line designated "2" in FIG. 1) in close physical proximity to the first bus line. For example, when the delay element 106 is coupled to the first bus line and another delay element (not shown) is coupled to the second bus line, the delay elements may prevent opposite signal transitions at the bus lines from occurring simultaneously, thereby reducing cross coupling effects (e.g., illustrated in phantom at 140) at the bus lines.

Figure 2:
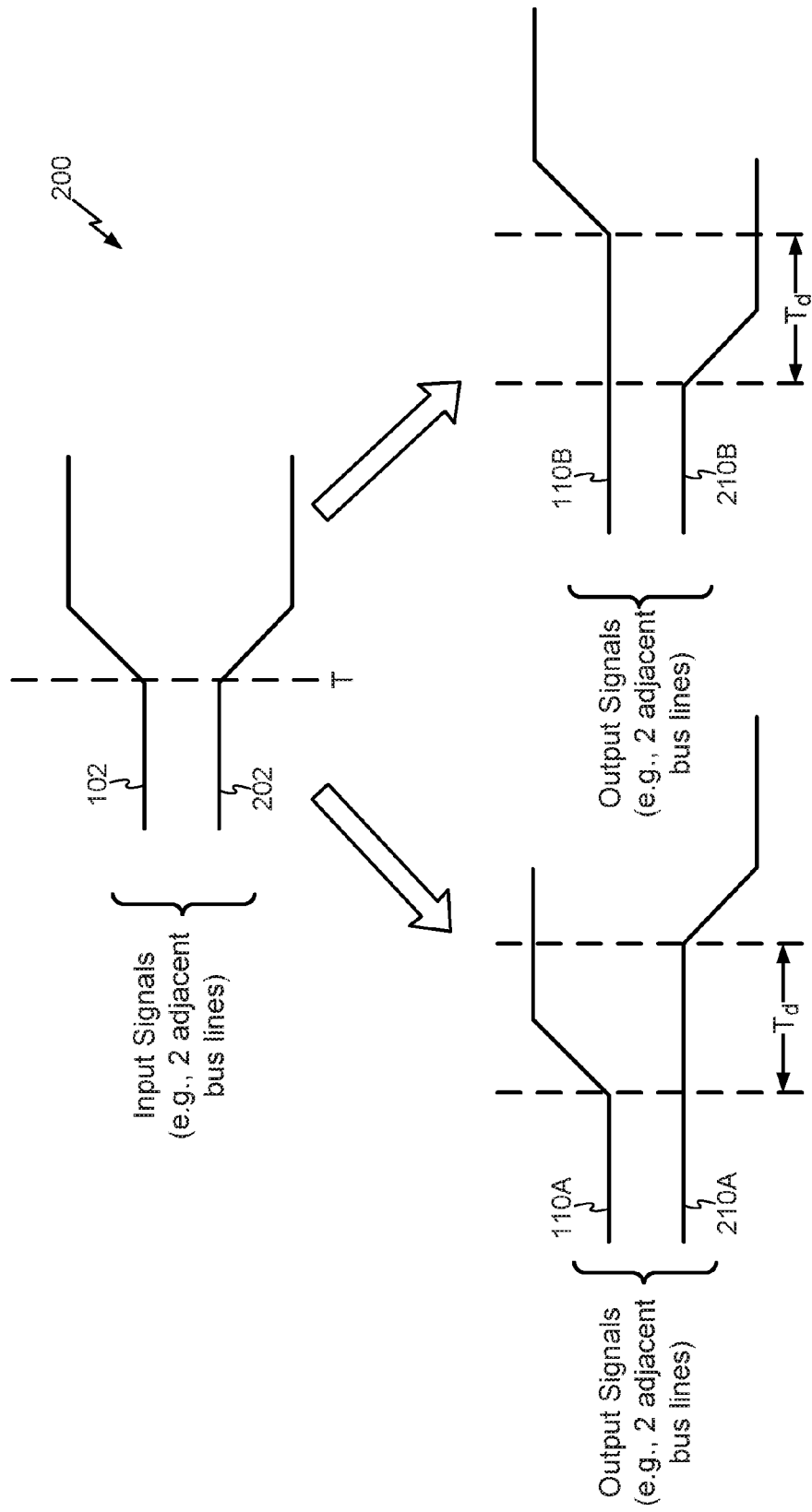
FIG. 2 is a diagram of a particular illustrative embodiment of signal transitions at the system of FIG. 1.

FIG. 2 illustrates operation of the system 100 of FIG. 1 and is generally designated 200. During operation of the system 100 of FIG. 1, the first component 120 may transmit signals to the second component 130 via the plurality of bus lines 108. For example, the first component 120 may transmit the signals 102, 202 across the adjacent first bus line and second bus line, respectively. At a time "T," the signals 102 and 202 may transition in opposite directions, as illustrated in FIG. 2. In response to the transitions in the signals 102 and 202, driver circuits 104 coupled to the bus lines may delay corresponding output signals so as to reduce the effect of cross coupling between the bus lines.

In a particular embodiment, the driver circuits 104 of FIG. 1 may have a "fast rising" and "slow falling" output, such that a time difference between a transition in an input signal and a corresponding rise in a corresponding output signal is shorter than a time difference between a transition in the input signal and a corresponding fall in the corresponding output signal. To illustrate, the output signals 110A and 210A depict an implementation having a "fast rising" and "slow falling" output.

Alternately, the driver circuits 104 of FIG. 1 may implement "slow rising" and "fast falling" output, such that a time difference between a transition in an input signal and a corresponding rise in a corresponding output signal is longer than a time difference between a transition in the input signal and a corresponding fall in the corresponding output signal. To illustrate, the output signals 110B and 210B depict an implementation having a "slow rising" and "fast falling" output.

A time difference $T_d$ corresponding to the difference in rising and falling delays may be selected such that the time difference $T_d$ is sufficient to reduce the effect of cross coupling between the bus lines. For example, the time difference $T_d$ may be determined after experimentation during hardware design and based on simulation of an electronic device or system, such as the system 100 of FIG. 1. To illustrate, if the input signals 102 and 202 resulted in simultaneous opposite transitions in the output signals, the energy dissipated due to coupling capacitance may be 2 $C_cV^2$. The time difference $T_d$ may be selected such that the simultaneous opposite transitions in the output signals instead become two successive instances of one output signal transitioning while the other remains constant (e.g., as illustrated by the output signal pairs 110A, 210A and 110B, 210B). Each of these instances may result in an energy dissipation of ½ $C_cV^2$. Thus, the total energy due to coupling capacitance may be reduced from 2 $C_cV^2$ to ½ $C_cV^2$+½ $C_cV^2$=$C_cV^2$. Such a time difference $T_d$ may be determined based on simulation and experimentation at adjacent bus lines. It should be noted that the time difference $T_d$ should be large enough to prevent signals in adjacent bus lines from switching in opposite directions at the same time, but also not too large as to unnecessarily slow down signals transitioning through the plurality of bus lines.

The selected time difference $T_d$ may be implemented by introducing delay elements into the circuit. For example, circuit elements having transistors whose switching delays can implement the time difference $T_d$ may be used. Accordingly, the time difference $T_d$ may be implemented as a number of picoseconds, a number of logic gate delays, or any other measure used by those having skill in the art. The system 100 of FIG. 1 may thus decrease power dissipation due to cross coupling at adjacent bus lines or bus lines in close proximity. In addition, the system 100 of FIG. 1 may provide an increase in battery life of an electronic device that includes the system 100 of FIG. 1.

FIG. 3 is a diagram of a particular illustrative embodiment of a skewed inverter circuit 300 that may be used to implement a delay function of the delay element 106 of FIG. 1. The skewed inverter circuit 300 may receive the input signal 102 and may produce the output signal 110.

The skewed inverter circuit 300 may include a first inverter 304, a second inverter 306, and a NAND gate 308. In a particular embodiment, the first inverter 304 may receive the input signal 102 transmitted from the first component 120 of FIG. 1. The second inverter 306 may receive an output of the first inverter 304. The NAND gate 308 may receive the input signal 102 and an output of the second inverter 306 and may produce the output signal 110. The output signal 110 produced by the skewed inverter circuit 300 (i.e., an output at the NAND gate 308) may be transmitted to the second component 130 of FIG. 1 via one of the bus lines of the plurality of bus lines 108 (e.g., the bus line designated '1' in FIG. 1).

During operation, the NAND gate 308 may receive the input signal 102 via the inverters 304, 306 at a first input 310 and may receive the input signal 102 directly at a second input 320. Thus, any rises or falls in the input signal 102 may arrive at the second input 320 prior to arriving at the first input 310. In response to a fall in the input signal 102 (e.g., from a logical '1' to a logical '0'), the NAND gate 308 may produce a corresponding rise in the output signal 110 once the fall of the input signal 102 reaches the second input 320. However, in response to a rise in the input signal 102 (e.g., from a logical '0' to a logical '1'), the NAND gate 308 may not produce a corresponding fall in the output signal 110 until the rise in the input signal 102 reaches both inputs 310, 320. The skewed inverter circuit 300 may thus produce a "fast rising, slow falling" output. The difference between the rise and fall times at the output signal 110 may be based on characteristics of the inverters 304, 306.

FIG. 4 is a diagram of another particular illustrative embodiment of a skewed inverter circuit 400 that may be used to implement functionality of the delay element 106 of FIG. 1. The skewed inverter circuit 400 may receive the input signal 102 and may produce the output signal 110.

The skewed inverter circuit 400 may include a first inverter 404, a second inverter 406, and a NOR gate 408. In a particular embodiment, the first inverter 404 may receive the input signal 102 transmitted from the first component 120 of FIG. 1. The second inverter 406 may receive an output of the first inverter 404. The NOR gate 408 may receive the input signal 102 and an output of the second inverter 406 and may produce the output signal 110. The output signal 110 may be transmitted to the second component 130 of FIG. 1 via one of the bus lines 108 (e.g., the bus line designated '1' in FIG. 1).

During operation, the NOR gate 408 may receive the input signal 102 via the inverters 404, 406 at a first input 410 and may receive the input signal 102 directly at a second input 420. Thus, any rises or falls in the input signal 102 may arrive at the second input 420 prior to arriving at the first input 410. In response to a rise in the input signal 102 (e.g. from a logical '0' to a logical '1'), the NOR gate 408 may produce a corresponding fall in the output signal 110 once the rise of the input signal 102 reaches the second input 420. However, in response to a fall in the input signal 102 (e.g., from a logical '1' to a logical '0'), the NOR gate 408 may not produce a corresponding rise in the output signal 110 until the fall in the input signal 102 reaches both inputs 410, 420. The skewed inverter circuit 400 may thus produce a "slow rising, fast falling" output. The difference between the rise and fall times at the output signal 110 may be based on characteristics of the inverters 404, 406. Although FIGS. 3-4 depict skewed inverter circuits that introduce 2 gates delay between rising and falling output, any number of gates delay may be implemented by adding or removing inverters and changing the logic gate accordingly. For example, two additional inverters may be inserted into the skewed inverter circuit 400 between the first inverter 404 and the second inverter 406 to implement four gates delay between rising and falling output.

Figure 5:
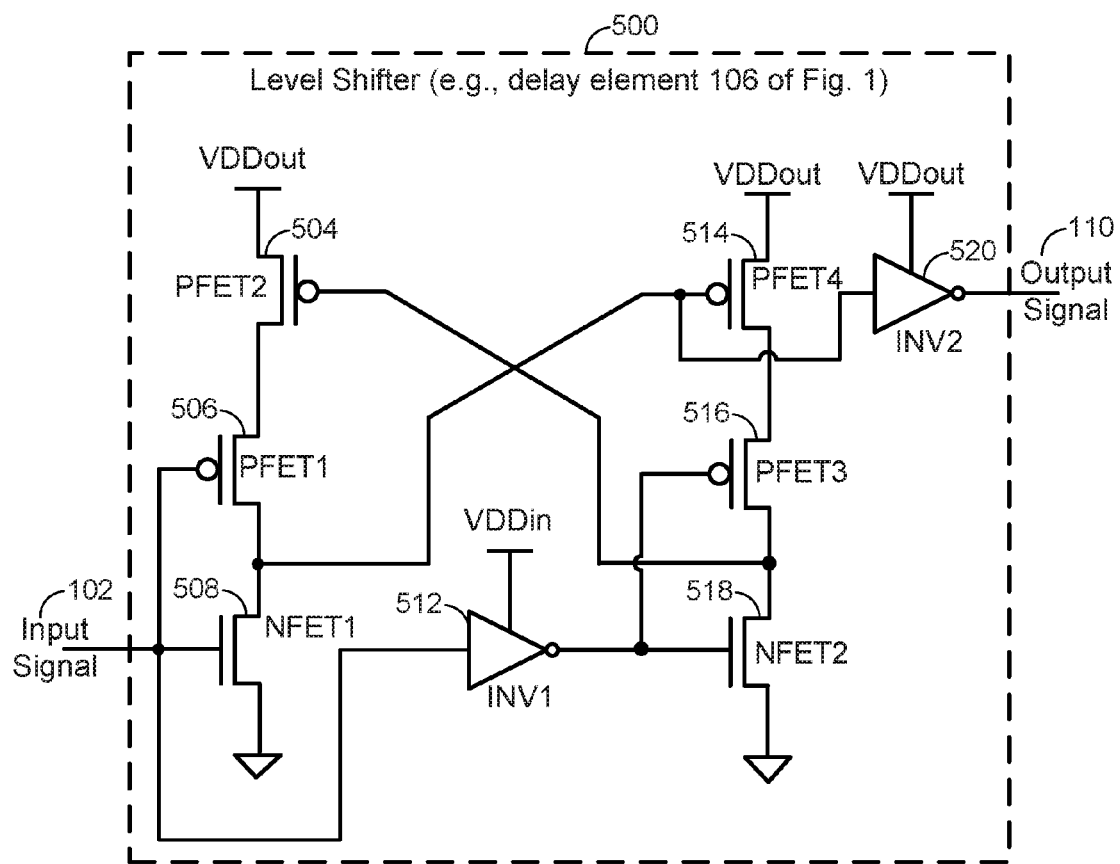
FIG. 5 is a diagram of a particular illustrative embodiment of a level shifter that implements the delay element of FIG. 1.

FIG. 5 is a diagram of a particular illustrative embodiment of a level shifter 500 that may be used to implement functionality of the delay element 106 of FIG. 1. For example, the level shifter 500 may receive the input signal 102 and may produce the output signal 110.

The level shifter 500 may include a first p-type field effect transistor (PFET) 506, a second PFET 504, a third PFET 516, and a fourth PFET 514. The level shifter 500 may also include a first n-type field effect transistor (NFET) 508, a second NFET 518, a first inverter 512, and a second inverter 520. The first PFET 506 may be coupled in series between the second PFET 504 and the first NFET 508. The third PFET 516 may be coupled in series between the fourth PFET 514 and the second NFET 518.

In a particular embodiment, the first NFET 508 may receive the input signal 102 transmitted from the first component 120 of FIG. 1 at a gate of the first NFET 508. In addition, the input signal 102 may be coupled to a gate of the first PFET 506 and an inverse of the input signal 102 may be coupled to a gate of the third PFET 516 and to a gate of the second NFET 518. A gate of the second PFET 504 may be coupled to a terminal of the third PFET 516 and to a terminal of the second NFET 518. A gate of the fourth PFET 514 may be coupled to a terminal of the first PFET 506, to a terminal of the first NFET 508, and to the second inverter 520 which may generate the output signal 110. A source voltage (e. $V_{DD_{out}}$) may be coupled to a terminal of the second PFET 504 and to a terminal of the fourth PFET 514. The same source voltage, $V_{DD_{out}}$ may also be applied to the second inverter 520. A terminal of the first NFET 508 and a terminal of the second NFET 518 may be coupled to ground or to another voltage lower than the source voltage $V_{DD_{out}}$. The output signal 110 produced by the level shifter 500 (i.e., the output at the second inverter 520) may be transmitted to the second component 130 of FIG. 1 via one of the bus lines 108 (e.g., the bus line designated '1' in FIG. 1).

During operation of the level shifter 500, in response to transitions in the input signal 102 (e.g., from a logical '1' to a logical '0' or vice versa), the level shifter 500 may delay the output signal 110 by an amount of time so as to reduce power dissipation due to cross coupling with an adjacent bus line or bus lines in close proximity.

To illustrate, the level shifter 500 may detect a rising edge in the input signal 102. In response, the input to the gate of the fourth PFET 514 and the input to the second inverter 520 may fall, resulting in a relatively "fast rising" output signal 110. In contrast, when the level shifter 500 detects a falling edge in the input signal 102, the input to the gates of the second NFET 518 and the third PFET 516 may rise, causing the input to the gate of the second PFET 504 to fall. This may result in the input to the gate of the fourth PFET 514 and the second inverter 520 to rise, causing a relatively "slow falling" output signal 110. In a particular embodiment, a rise in the input signal 102 may be a logical '0' to logical '1' transition and a fall in the input signal 102 may be a logical '1' to logical '0' transition.

Thus, by coupling driver circuits that each include the level shifter 500 to adjacent bus lines, the effect of cross coupling due to concurrent signal transitions in opposite directions may be reduced.

Figure 6:
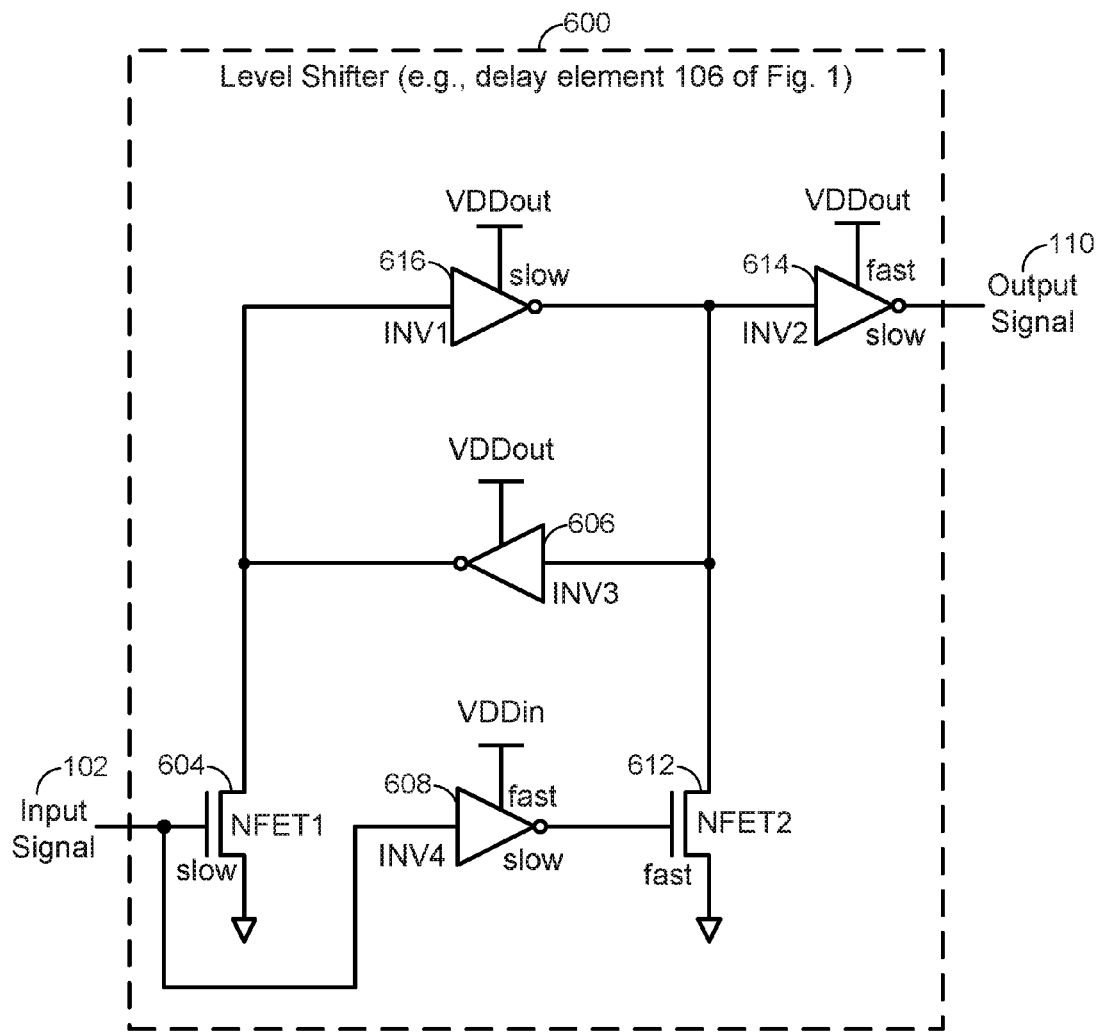
FIG. 6 is a diagram of another particular illustrative embodiment of a level shifter that implements the delay element of FIG. 1.

FIG. 6 is a diagram of another particular illustrative embodiment of a level shifter 600 that may be used to implement functionality of the delay element 106 of FIG. 1. For example, the level shifter 600 may receive the input signal 102 and may produce the output signal 110.

The level shifter 600 may include a first n-type field effect transistor (NFET) 604 and a second NFET 612. As illustrated in FIG. 6, the first NFET 604 may be a "slow" NFET (e.g., may have a relatively long channel, a relatively high threshold voltage, or a relatively narrow width) and the second NFET 612 may be a "fast" NFET (e.g., may have a relatively short channel, a relatively low threshold voltage, or a relatively large width). The level shifter 600 may also include a first inverter 616, a second inverter 614, a third inverter 606, and a fourth inverter 608. As illustrated in FIG. 6, the first inverter 616 may have a "slow rising" output. The second inverter 614 and the fourth inverter 608 may have a "fast rising" and "slow falling" output (e.g., similar to the skewed inverter circuit 300 of FIG. 3). The first inverter 616 may be coupled to the second inverter 614. The third inverter 606 may be coupled to the first inverter 616. The fourth inverter 608 may be coupled between the first NFET 604 and the second NFET 612.

In a particular embodiment, the first NFET 604 may receive the input signal 102 transmitted from the first component 120 of FIG. 1 at a gate of the first NFET 604. The input signal 102 may be coupled to an input of the fourth inverter 608, and the second NFET 612 may be coupled to an output of the fourth inverter 608. A terminal of the first NFET 604 may be coupled to an output of the third inverter 606 and to an input of the first inverter 616. An output of the first inverter 616 may be coupled to an input of the second inverter 614, to an input of the third inverter 606, and to a terminal of the second NFET 612. An output of the second inverter 614 may provide the output signal 110 of the level shifter 600. A source voltage (e.g., $V_{DD_{out}}$) may be applied to the first inverter 616, to the second inverter 614, and to the third inverter 606. Another source voltage (e.g., $V_{DD_{in}}$) may be applied to the fourth inverter. A terminal of the first NFET 604 and a terminal of the second NFET 612 may be coupled to ground or to another voltage lower than either of the source voltages $V_{DD_{in}}$ and $V_{DD_{out}}$. The output signal 110 produced by the level shifter 600 (i.e., the output at the second inverter 614) may be transmitted to the second component 130 of FIG. 1 via one of the bus lines 108 (e.g., the bus line designated '1' in FIG. 1).

During operation of the level shifter 600, in response to transitions in the input signal 102 (e.g., from a logical '1' to a logical '0' or vice versa), the level shifter 600 may delay the output signal 110 so as to reduce power dissipation due to cross coupling with an adjacent bus line or bus lines in close proximity.

To illustrate, the level shifter 600 may detect a falling edge in the input signal 102. In response, the input to the gate of the second NFET 612 may rise, causing the input to the second inverter 614 and input to the third inverter 606 to fall. This may result in a relatively "fast rising" output signal 110. In contrast, when the level shifter 600 detects a rising edge in the input signal 102, the input to the first inverter 616 may fall, causing the input to the second inverter 614 and input to the third inverter 606 to rise relatively slowly. This may result in a relatively "slow falling" output signal 110. Thus, by coupling driver circuits that each include the level shifter 600 to adjacent bus lines, the effect of cross coupling due to concurrent signal transitions in opposite directions may be reduced.

Figure 7:
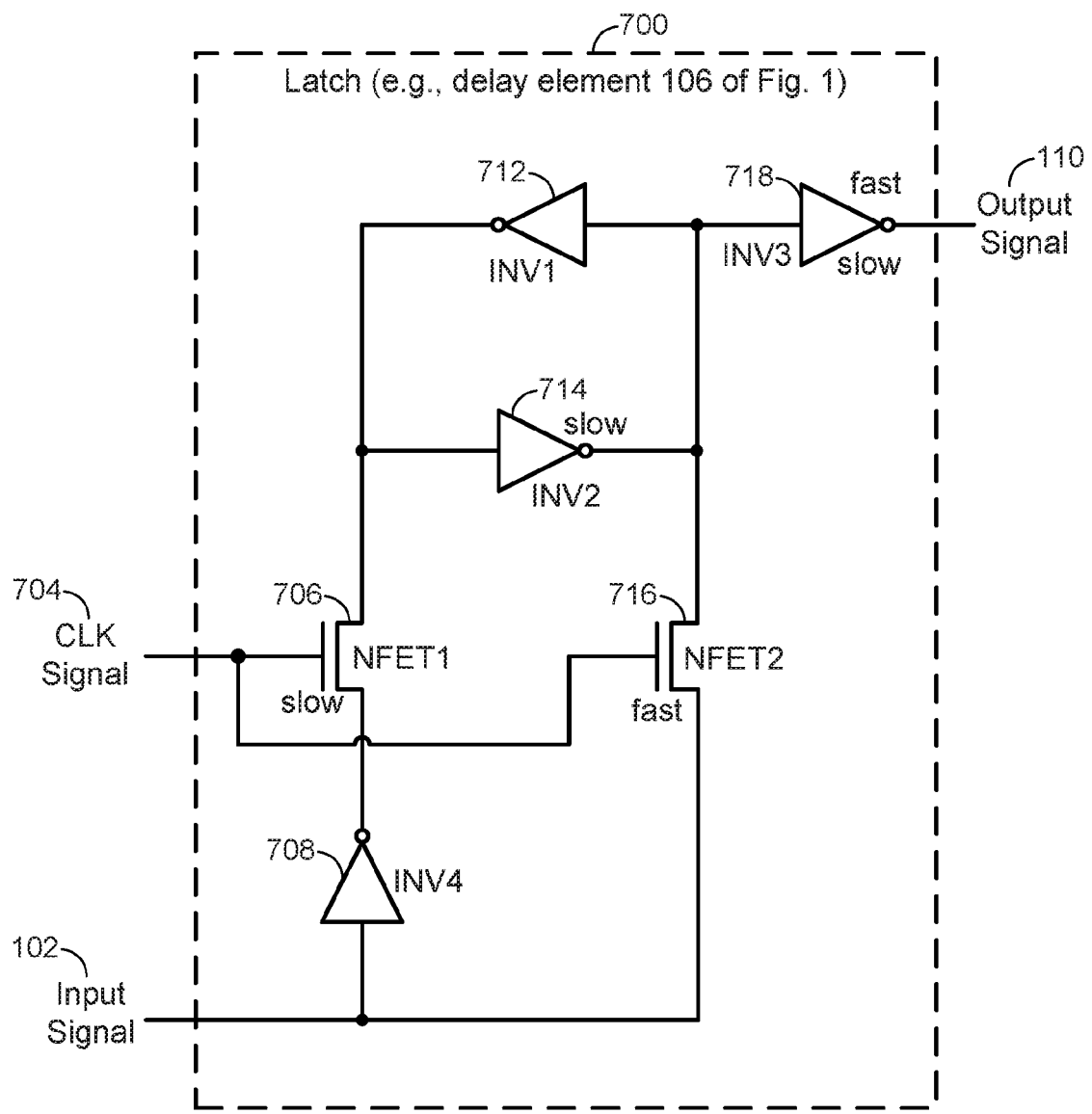
FIG. 7 is a diagram of a particular illustrative embodiment of a latch that implements the delay element of FIG. 1.

FIG. 7 is a diagram of a particular illustrative embodiment of a latch 700 that may be used to implement functionality of the delay element 106 of FIG. 1. For example, the latch 700 may receive the input signal 102 and may produce the output signal 110. The latch 700 may also receive a clock (CLK) signal 704.

The latch 700 may include a first n-type field effect transistor (NFET) 706 and a second NFET 716. As illustrated in FIG. 7, the first NFET 706 may be a "slow" NFET and the second NFET 716 may be a "fast" NFET. The latch 700 may also include a first inverter 712, a second inverter 714, a third inverter 718, and a fourth inverter 708. As illustrated in FIG. 7, the second inverter 714 may have a "slow rising" output and the third inverter 718 may have a "fast rising" and "slow falling" output (e.g., similar to the skewed inverter circuit 300 of FIG. 3).

In a particular embodiment, the second NFET 716 may receive the input signal 102 transmitted from the first component 120 of FIG. 1 at a terminal of the second NFET 716. In addition, an inverse of the input signal from the fourth inverter 708 may be coupled to a terminal of the first NFET 706. The CLK signal 704 may be coupled to a gate of the first NFET 706 and to a gate of the second NFET 716. The first NFET 706 may be coupled to an output of the first inverter 712 and to an input of the second inverter 714. The second NFET 716 may be coupled to an output of the second inverter 714, to an input of the first inverter 712, and to an input of the third inverter 718. An output of the third inverter 718 may provide the output signal 110 of the latch 700. The output signal 110 produced by the latch 700 (i.e., the output at the third inverter 718) may be transmitted to the second component 130 of FIG. 1 via one of the bus lines 108 (e.g., the bus line designated '1' in FIG. 1).

During operation of the latch 700, in response to transitions in the input signal 102 (e.g., from a logical '1' to a logical '0' or vice versa), the latch 700 may delay the output signal 110 so as to reduce power dissipation due to cross coupling with an adjacent bus line or bus lines in close proximity.

To illustrate, the latch 700 may detect a falling edge of the input signal 102. When the latch 700 subsequently detects a rising edge in the input signal 102 while the CLK signal 704 is a logic high (which represents an enable signal for the latch 700), the input to the first inverter 712 and the input to the third inverter 718 may fall, resulting in a relatively "fast rising" output signal 110. In contrast, when the latch 700 detects a falling edge in the input signal 102 while the CLK signal 704 is a logic high, the input to the second inverter 714 may fall, causing the input to the first inverter 712 and the input to the third inverter 718 to rise relatively slowly. This may result in a relatively "slow falling" output signal 110. Thus, by coupling driver circuits that each include the latch 700 to adjacent bus lines, the effect of cross coupling due to concurrent signal transitions in opposite directions may be reduced.

Figure 8:
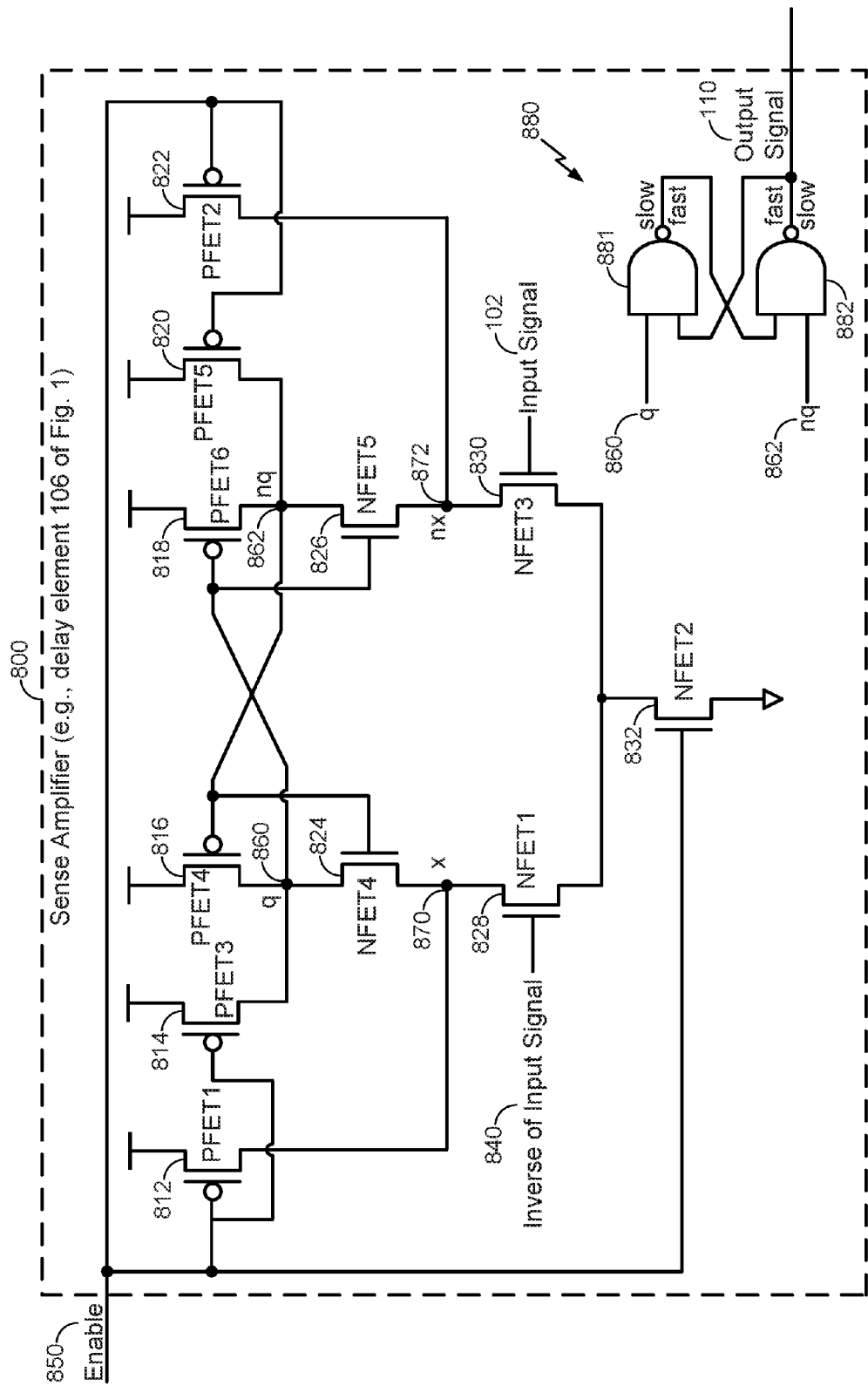
FIG. 8 is a diagram of a particular illustrative embodiment of a sense amplifier that implements the delay element of FIG. 1.

FIG. 8 is a diagram of a particular illustrative embodiment of a sense amplifier 800 that may be used to implement functionality of the delay element 106 of FIG. 1. For example, the sense amplifier 800 may receive a differential input (e.g., the input signal 102 and an inverse 840 of the input signal 102) and may produce the output signal 110. The sense amplifier 800 may also receive an enable signal 850 (e.g., a clock signal).

The sense amplifier 800 may include a first n-type field effect transistor (NFET) 828 coupled in series between a first p-type field effect transistor (PFET) 812 and a second NFET 832. The sense amplifier may also include a third NFET 830 coupled in series between a second PFET 822 and the second NFET 832. A third PFET 814 and a fourth PFET 816 may each be coupled in series with the first NFET 828 via a fourth NFET 824. A fifth PFET 820 and a sixth NFET 818 may each be coupled in series with the third NFET 830 via a fifth NFET 826. The enable signal 850 may be coupled to a gate of the first PFET 812, a gate of the second PFET 822, a gate of the third PFET 814, a gate of the fifth PFET 820, and a gate of the second NFET 832. The input signal 102 may be coupled to a gate of the third NFET 830, and the inverse 840 of the input signal 102 may be coupled to a gate of the first NFET 828. In a particular embodiment, the third NFET 830 may receive the input signal 102 transmitted from the first component 120 of FIG. 1 at a gate of the third NFET 830. In addition, a gate of the fourth PFET 816 may be coupled to a gate of the fourth NFET 824, a terminal of the sixth PFET 818, and a terminal of the fifth NFET 826. Similarly, a gate of the sixth PFET 818 may be coupled to a gate of the fifth NFET 826, a terminal of the fourth PFET 816, and a terminal of the fourth NFET 824.

In addition, the sense amplifier 800 may include cross-coupled NAND gates 880. The cross-coupled NAND gates 880 may include a first NAND gate 881 and a second NAND gate 882. A first input of the first NAND gate 881 may be coupled to a node q 860 and may receive a signal produced at the node q 860. A second input of the first NAND gate 881 may be coupled to an output of the second NAND gate 882. A first input of the second NAND gate 882 may be coupled to an output of the first NAND gate 881. A second input of the second NAND gate 882 may be coupled to a node nq 862 and may receive a signal produced at the node nq 862. The output of the second NAND gate 882 may provide the output signal 110 of the sense amplifier 800. The output signal 110 produced by the sense amplifier 800 (i.e., the output at the second NAND gate 882) may be transmitted to the second component 130 of FIG. 1 via one of the bus lines 108 (e.g., the bus line designated '1' in FIG. 1). As illustrated in FIG. 8, the first NAND gate 881 may have a "slow rising" and "fast falling" output, and the second NAND gate 882 may have a "fast rising" and "slow falling" output. It should be noted that the cross-coupled NAND gates 880 are part of the sense amplifier 800 and coupled at nodes q 860 and nq 862, and are shown separately from other components of the sense amplifier 800 merely for ease of illustration.

During operation of the sense amplifier 800, in response to transitions in the inputs signal 102 (e.g., from a logical '1' to a logical '0' or vice versa), the sense amplifier 800 may delay the output signal 110 so as to reduce power dissipation due to cross coupling with an adjacent bus line or bus lines in close proximity.

To illustrate, when the sense amplifier 800 detects a '0' value in the enable signal 850, the input signal 102 and the inverse 840 of the input signal 102 may be externally held high in a precharge state. The nodes q 860 and nq 862, and internal nodes x 870 and nx 872 may also be precharged high. The cross-coupled NAND gates 880 (driven by the nodes q 860 and nq 862) may behave as inverters, thereby causing the output signal 110 of the sense amplifier 800 to maintain an initial state. During a read operation in which the input signal 102 begins to discharge (e.g., exhibit a falling edge), the nodes nx 870 and nq 862 may remain high when the enable signal 850 is asserted. This may cause the signal at the node x 870 to fall, which causes the output signal at the node q 860 to fall. The delay between the assertion of the enable signal 850 and a rise of the output signal 110 may be relatively fast, whereas a delay between the assertion of the enable signal 850 and a fall of the output signal 110 may be relatively slow. Thus, by coupling driver circuits that each include the sense amplifier 800 to adjacent bus lines, the effect of cross coupling due to concurrent signal transitions in opposite directions may be reduced.

Figure 9:
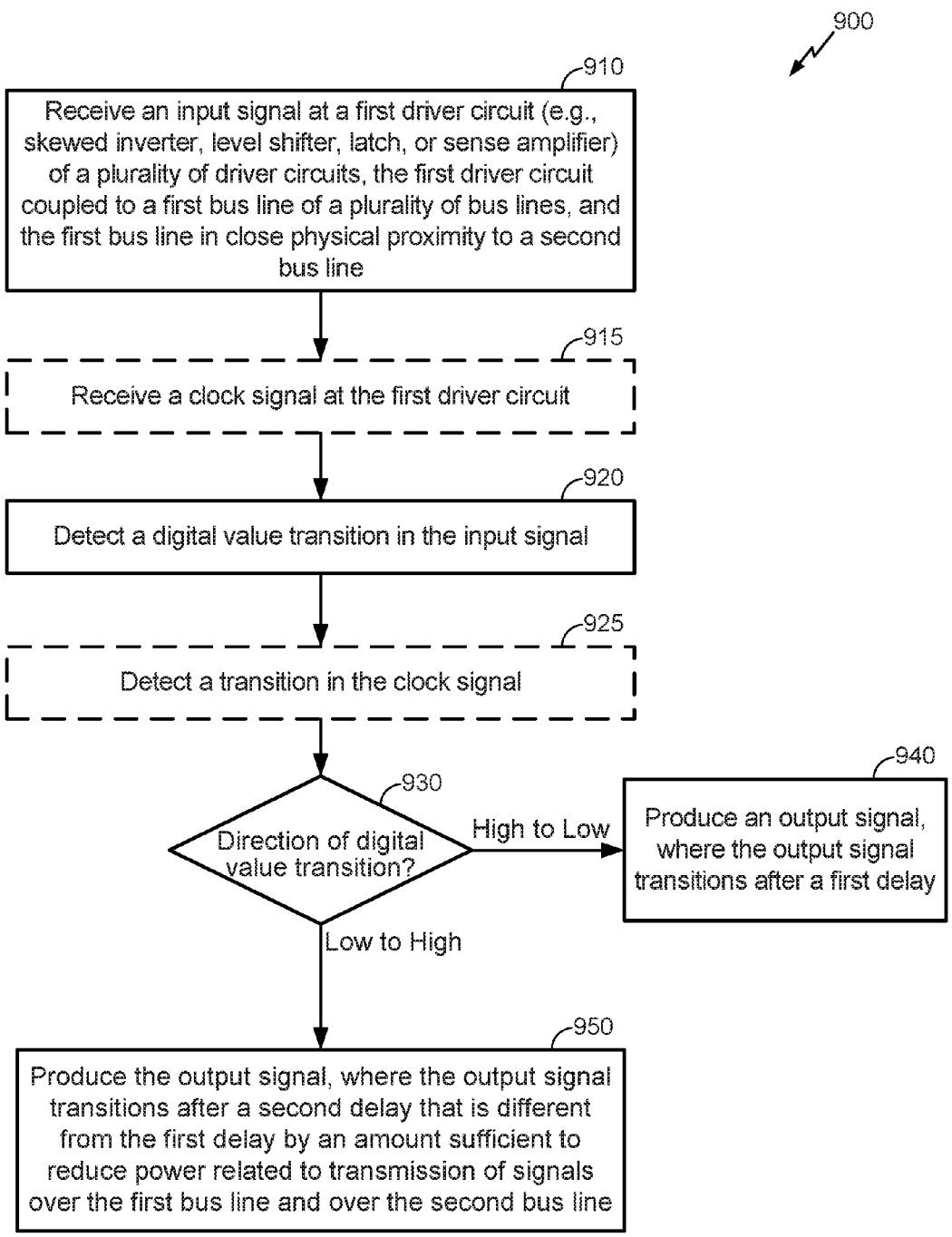
FIG. 9 is a flow chart of a particular illustrative embodiment of a method to reduce cross coupling effects on bus lines.

Referring to FIG. 9, a particular illustrative embodiment of a method to reduce cross coupling effects on bus lines is disclosed and generally designated 900. In an illustrative embodiment, the method 900 may be performed at the system 100 of FIG. 1, and may use any of the skewed inverter circuit 300 of FIG. 3, the skewed inverter circuit 400 of FIG. 4, the level shifter 500 of FIG. 5, the level shifter 600 of FIG. 6, the latch 700 of FIG. 7, and the sense amplifier 800 of FIG. 8.

The method 900 includes receiving an input signal at a first driver circuit of a plurality of driver circuits, at 910. In a particular embodiment, the first driver circuit includes a delay element 106 that is implemented using a skewed inverter circuit (e.g., the skewed inverter circuit 300 of FIG. 3 or the skewed inverter circuit 400 of FIG. 4), a level shifter (e.g., the level shifter 500 of FIG. 5 or the level shifter 600 of FIG. 6), a latch (e.g., the latch 700 of FIG. 7), or a sense amplifier (e.g., the sense amplifier 800 of FIG. 8). The first driver circuit may be coupled to a first bus line of a plurality of bus lines. For example, in FIG. 1, the first component 120 may transmit the input signal 102 to the second component 130 via the plurality of bus lines 108. Further, the first bus line may be in close physical proximity to a second bus line. A first driver circuit including the delay element 106 may be coupled to the first bus line (e.g., designated '1' in FIG. 1) that is in close physical proximity to the second bus line (e.g., designated '2' in FIG. 1). The delay element 106 may receive the input signal 102 from the first component 120. When the delay element is implemented using a clocked circuit (e.g., the latch 700 of FIG. 7 or the sense amplifier 800 of FIG. 8 where the enable signal 850 is a clock signal), the method 900 may optionally include receiving a clock signal at the first driver circuit, at 915.

The method 900 includes detecting a digital value transition in the input signal 102, at 920. For example, in FIG. 1, the delay element 106 may detect a digital value transition in the input signal 102. When the first driver circuit receives the clock signal at 915, the method 900 may optionally include detecting a transition on the clock signal, at 925.

The method 900 further includes determining the direction of the digital value transition, at 930. When the direction of the digital value transition is from low to high, the method 900 may include producing an output signal after a first delay, at 940. For example, as illustrated in FIG. 2, the output signal 110A or 110B may be produced after a first delay. When the direction of digital value transition is from high to low, the method 900 may include producing the output signal after a second delay that is different from the first delay, at 950. For example, as illustrated in FIG. 2, the output signal 210A or 210B may be produced after a second delay. The difference between the first delay and the second delay may be an amount sufficient to reduce power related to transmission of signals over the first bus line and over the second bus line. For example, as illustrated in FIG. 2, the time difference $T_d$ may be selected to reduce cross coupling between the first and second bus lines.

It should be noted that the method 900 of FIG. 9 may reduce cross coupling at the bus lines by either delaying high to low digital value transitions more than low to high digital value transitions, or vice versa. For example, the second bus line referenced in FIG. 9 may be coupled to a second driver circuit having a second delay element. The second delay element may receive a second input signal concurrently with the receipt of the input signal at the delay element, at 910. The second delay element may produce a second output signal. Similar to the output signal produced at 940, the second output signal may transition after the first delay when the second input signal transitions from low to high. In addition, similar to the output signal produced at 950, the second output signal may transition after the second delay when the second input signal transitions from high to low.

Figure 10:
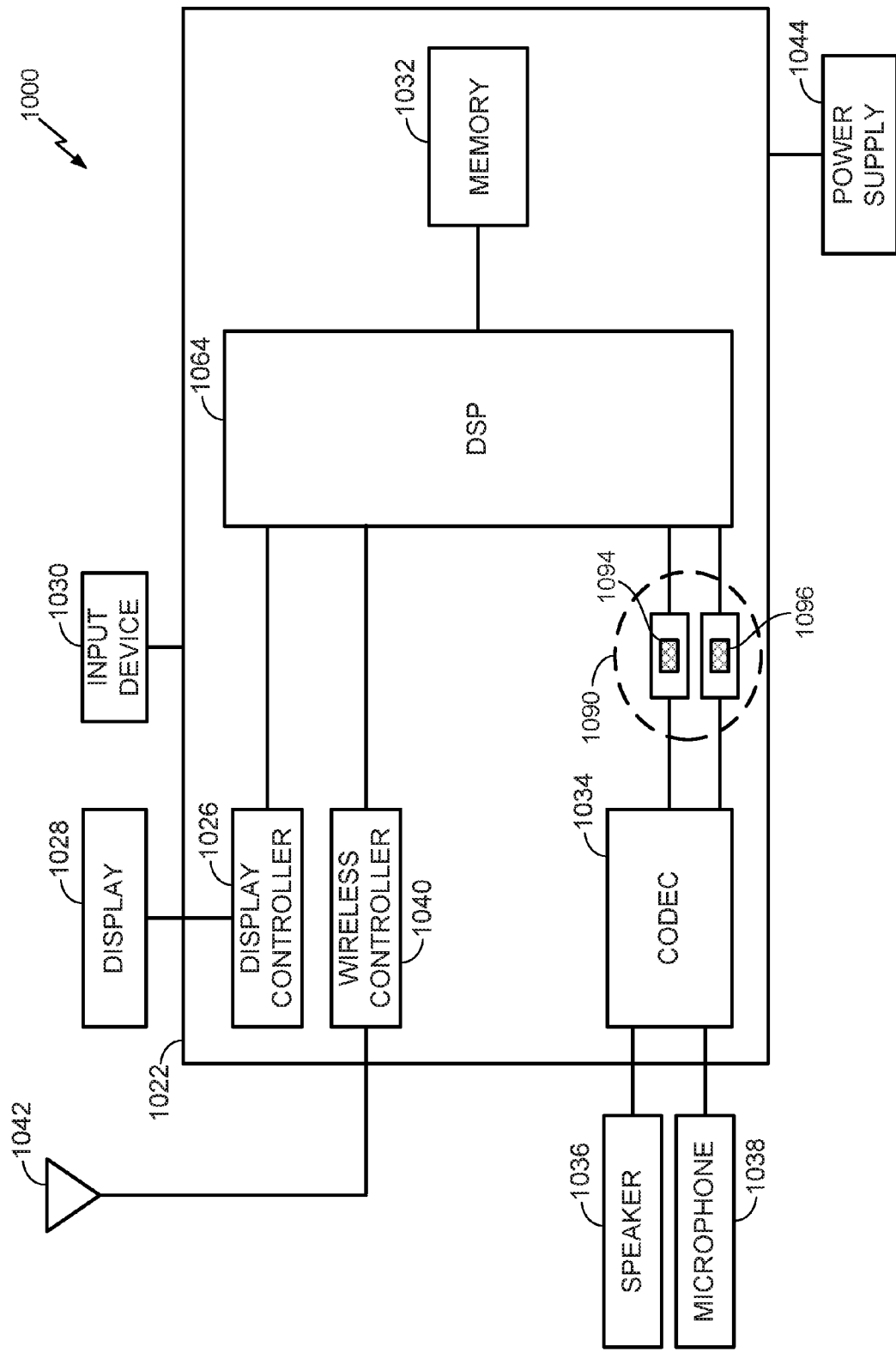
FIG. 10 is a block diagram of a wireless device including a system to reduce cross coupling effects on bus lines.

Referring to FIG. 10, a block diagram of a particular illustrative embodiment of a wireless device that includes a system to reduce cross couplings effect at bus lines is depicted and generally designated 1000. The device 1000 includes a processor, such as a digital signal processor (DSP) 1064, coupled to a memory 1032. The device may also include driver circuits 1090 including respective delay elements 1094, 1096. A first component (e.g., a coder/decoder (CODEC) 1034) may transmit signals to a second component (e.g., the DSP 1064) via a plurality of bus lines. The delay element 1094 may be coupled to a first bus line of the plurality of bus lines 1090 and the delay element 1096 may be coupled to a second bus line of the plurality of bus lines 1090. It should be noted that the delay elements may be coupled to any bus line (or all bus lines) in the device 1000 that is used to transmit signals between the various components of the device 1000. In an illustrative embodiment, the delay elements 1094, 1096 may each be implemented by the skewed inverter circuit 300 of FIG. 3, the skewed inverter circuit 400 of FIG. 4, the level shifter 500 of FIG. 5, the level shifter 600 of FIG. 6, the latch 700 of FIG. 7, or the sense amplifier 800 of FIG. 8.

FIG. 10 also shows a display controller 1026 that is coupled to the DSP 1064 and to a display 1028. The coder/decoder (CODEC) 1034 can also be coupled to the DSP 1064. A speaker 1036 and a microphone 1038 can be coupled to the CODEC 1034.

FIG. 10 also indicates that a wireless controller 1040 can be coupled to the DSP 1064 and to a wireless antenna 1042. In a particular embodiment, the DSP 1064, the display controller 1026, the memory 1032, the CODEC 1034, the wireless controller 1040, and the driver circuits 1090 including the delay element 1094 are included in a system-in-package or system-on-chip device 1022. In a particular embodiment, an input device 1030 and a power supply 1044 are coupled to the system-on-chip device 1022. Moreover, in a particular embodiment, as illustrated in FIG. 10, the display 1028, the input device 1030, the speaker 1036, the microphone 1038, the wireless antenna 1042, and the power supply 1044 are external to the system-on-chip device 1022. However, each of the display 1028, the input device 1030, the speaker 1036, the microphone 1038, the wireless antenna 1042, and the power supply 1044 can be coupled to a component of the system-on-chip device 1022, such as an interface or a controller.

In conjunction with the described embodiments, an apparatus is disclosed that includes means for delaying an output signal at a first bus line of a plurality of bus lines based on a digital value transition of an input signal at the first bus line. For example, the means for delaying may be one of the driver circuits 104 of FIG. 1, the delay element 106 of FIG. 1, the skewed inverter circuit 300 of FIG. 3, the skewed inverter circuit 400 of FIG. 4, the level shifter 500 of FIG. 5, the level shifter 600 of FIG. 6, the latch 700 of FIG. 7, the sense amplifier 800 of FIG. 8, one of the driver circuits 1090 of FIG. 10, the delay element 1094 of FIG. 10, the delay element 1096 of FIG. 10, one or more other devices configured to delay the output signal, or any combination thereof.

The apparatus may also include means for providing the input signal to the means for delaying. For example, the means for providing may include the first component 120 of FIG. 1, a component of the device 1000 of FIG. 10 (e.g., the CODEC 1034), one or more devices configured to provide the input signal to the means for delaying, or any combination thereof. The output signal may transition after a first delay in response to a first digital value transition of the input signal from high to low and may transition after a second delay in response to a second digital value transition of the input signal from low to high. The first delay amount may be different from the second delay amount by an amount sufficient to reduce power related to transmission of a signal over the first bus line and over a second bus line in close physical proximity to the first bus line.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
a first driver circuit coupled to a first bus line, wherein the first driver circuit includes a first delay element configured to:
receive a first input signal; and
generate a first output signal based on the first input signal, wherein the first output signal transitions logic levels after a first delay period responsive to the first input signal transitioning from a logic high level to a logic low level, wherein the first output signal transitions logic levels after a second delay period responsive to the first input signal transitioning from the logic low level to the logic high level, wherein the first delay element includes a sense amplifier that includes cross-coupled NAND gates, and wherein the first driver circuit is configured to transmit the first output signal over the first bus line; and
a second driver circuit coupled to a second bus line, wherein the second driver circuit is configured to transmit a second output signal over the second bus line.

2. The device of claim 1, wherein the second bus line is in close physical proximity to the first bus line, and wherein the first driver circuit, the second driver circuit, the first bus line, and the second bus line are included in a mobile device.

3. The device of claim 1, wherein the sense amplifier comprises a first pair of precharge p-type metal oxide semiconductor (PMOS) transistors, wherein a first PMOS transistor of the first pair of precharge PMOS transistors is configured to pull up a voltage at a terminal of a first n-type metal oxide semiconductor (NMOS) transistor and a terminal of a second NMOS transistor, and wherein a second PMOS transistor of the first pair of precharge PMOS transistors is configured to pull up a voltage at a terminal of a third NMOS transistor and a terminal of a fourth NMOS transistor.

4. The device of claim 3, wherein the sense amplifier further comprises a second pair of precharge PMOS transistors, wherein a third PMOS transistor of the second pair of precharge PMOS transistors is configured to pull up a voltage at a gate of a fifth PMOS transistor and a gate of the first NMOS transistor, and wherein a fourth PMOS transistor of the second pair of precharge PMOS transistors is configured to pull up a voltage at a gate of a sixth PMOS transistor and a gate of the third NMOS transistor.

5. The device of claim 4, wherein the first PMOS transistor and the fourth PMOS transistor are coupled in series with the second NMOS transistor via the first NMOS transistor, wherein the second PMOS transistor and the third PMOS transistor are coupled in series with the fourth NMOS transistor via the third NMOS transistor, wherein the second NMOS transistor is coupled in series between the first PMOS transistor and a fifth NMOS transistor, and wherein the fourth NMOS transistor is coupled in series between the second PMOS transistor and the fifth NMOS transistor.

6. The device of claim 4, wherein a first input of the cross-coupled NAND gates is coupled to a terminal of the fourth PMOS transistor, to a terminal of the first PMOS transistor, and to a second terminal of the first NMOS transistor, wherein a second input of the cross-coupled NAND gates is coupled to a terminal of the third PMOS transistor, to a terminal of the second PMOS transistor, and to a second terminal of the third NMOS transistor, and wherein the cross-coupled NAND gates are configured to generate the first output signal.

7. The device of claim 1, wherein the first input signal comprises a differential signal, and wherein the cross-coupled NAND gates are configured to generate the first output signal.

8. The device of claim 1, wherein the sense amplifier includes a first output node coupled to a first input terminal of a first NAND gate of the cross-coupled NAND gates and includes a second output node coupled to a second input of a second NAND gate of the cross-coupled NAND gates.

9. The device of claim 8, wherein a third input terminal of the first NAND gate is coupled to a first output terminal of a second NAND gate, and wherein a fourth input terminal of the second NAND gate is coupled to a second output terminal of a first NAND gate.

10. The device of claim 1, wherein the sense amplifier comprises four precharge p-type metal oxide semiconductor (PMOS) transistors, each precharge PMOS transistor having a gate configured to receive to an enable signal.

11. The device of claim 1, wherein the sense amplifier comprises an internal node coupled to a source/drain of a precharge p-type metal oxide semiconductor (PMOS) transistor and a source/drain of each of a first n-type metal oxide semiconductor (NMOS) transistor and a second NMOS transistor.

12. The device of claim 1, further comprising:
a coder/decoder;
a digital signal processor coupled to the coder/decoder via the first bus line and the second bus line, wherein the coder/decoder and the digital signal processor are incorporated into a mobile communication device; and
an antenna coupled to the digital signal processor and configured to transmit and receive encoded signals.

13. A method comprising:
receiving a first input signal at a first delay element, wherein the first delay element includes a sense amplifier coupled to a first bus line, and wherein the sense amplifier includes cross-coupled NAND gates; and
generating a first output signal at the first delay element based on the first input signal, wherein the first output signal transitions logic levels after a first delay period responsive to the first input signal transitioning from a logic high level to a logic low level, and wherein the first output signal transitions logic levels after a second delay period responsive to the first input signal transitioning from the logic low level to the logic high level.

14. The method of claim 13, further comprising:
receiving a second input signal at a second delay element, wherein the second delay element is coupled to a second bus line, and wherein the second delay element receives the second input signal concurrently with the first delay element receiving the first input signal; and
generating a second output signal at the second delay element.

15. The method of claim 14, wherein, responsive to the first output signal and the second output signal transitioning to opposite logic levels, a difference between the first delay period and the second delay period prevents the first output signal and the second output signal from transitioning to opposite logic levels simultaneously.

16. The method of claim 13, further comprising:
pulling up a voltage at a terminal of a first n-type metal oxide semiconductor (NMOS) transistor and a terminal of a second NMOS transistor by a first p-type metal oxide semiconductor (PMOS) transistor of a first pair of precharge PMOS transistors of the sense amplifier; and
pulling up a voltage at a terminal of a third NMOS transistor and a terminal of a fourth NMOS transistor by a second PMOS transistor of the first pair of precharge PMOS transistors.

17. The method of claim 16, further comprising:
pulling up a voltage at a gate of a fifth PMOS transistor and a gate of the first NMOS transistor by a third PMOS transistor of a second pair of precharge PMOS transistors of the sense amplifier; and
pulling up a voltage at a gate of a sixth PMOS transistor and a gate of the third NMOS transistor by a fourth PMOS transistor of the second pair of precharge PMOS transistors.

18. The method of claim 17, further comprising applying an enable signal to a gate of the first PMOS transistor, a gate of the second PMOS transistor, a gate of the third PMOS transistor, and a gate of the fourth PMOS transistor.

19. The method of claim 16, further comprising applying the first input signal to a gate of the fourth NMOS transistor and an inverse of the input signal to a gate of the second NMOS transistor.

20. The method of claim 16, further comprising generating the first output signal at the cross-coupled NAND gates of the sense amplifier.

21. An apparatus comprising:
means for delaying a first output signal at a first bus line based on a transition of a first input signal, wherein the first output signal is delayed for a first delay period responsive to the first input signal transitioning from a logic high level to a logic low level, wherein the first output signal is delayed for a second delay period responsive to the first input signal transitioning from the logic low level to the logic high level, and wherein the means for delaying the first output signal includes a sense amplifier that includes cross-coupled NAND gates; and
means for delaying a second output signal at a second bus line based on a transition of a second input signal.

22. The apparatus of claim 21, further comprising:
means for providing the first input signal to the means for delaying the first output signal, wherein the means for providing comprises a component of an electronic device;
means for coding and decoding; and
means for processing, wherein the means for coding and decoding is coupled to the means for processing via the first bus line, and wherein the first output signal is transmitted to the means for processing over the first bus line.

23. The apparatus of claim 21, wherein the sense amplifier comprises a first pair of precharge p-type metal oxide semiconductor (PMOS) transistors, wherein a first PMOS transistor of the first pair of precharge PMOS transistors is configured to pull up a voltage at a terminal of a first n-type metal oxide semiconductor (NMOS) transistor and a terminal of a second NMOS transistor, and wherein a second PMOS transistor of the first pair of precharge PMOS transistors is configured to pull up a voltage at a terminal of a third NMOS transistor and a terminal of a fourth NMOS transistor.

24. The apparatus of claim 23, wherein the sense amplifier further comprises a second pair of precharge PMOS transistors, wherein a third PMOS transistor of the second pair of precharge PMOS transistors is configured to pull up a voltage at a gate of a fifth PMOS transistor and a gate of the first NMOS transistor, and wherein a fourth PMOS transistor of the second pair of precharge PMOS transistors is configured to pull up a voltage at a gate of a sixth PMOS transistor and a gate of the third NMOS transistor.

25. An apparatus comprising:
a first bus line; and
a sense amplifier coupled to the first bus line and including cross-coupled NAND gates, the sense amplifier configured to:
receive a first input signal;
generate a first output signal, wherein the first output signal transitions logic levels after a first delay period responsive to the first input signal transitioning from a logic high level to a logic low level, and wherein the first output signal transitions logic levels after a second delay period responsive to the first input signal transitioning from the logic low level to the logic high level; and
transmit the first output signal over the first bus line.

26. The apparatus of claim 25, wherein the sense amplifier comprises a first pair of precharge p-type metal oxide semiconductor (PMOS) transistors, wherein a first PMOS transistor of the first pair of precharge PMOS transistors is configured to pull up a voltage at a terminal of a first n-type metal oxide semiconductor (NMOS) transistor and a terminal of a second NMOS transistor, wherein a second PMOS transistor of the first pair of precharge PMOS transistors is configured to pull up a voltage at a terminal of a third NMOS transistor and a terminal of a fourth NMOS transistor, wherein the sense amplifier further comprises a second pair of precharge PMOS transistors, wherein a third PMOS transistor of the second pair of precharge PMOS transistors is configured to pull up a voltage at a gate of a fifth PMOS transistor and a gate of the first NMOS transistor, and wherein a fourth PMOS transistor of the second pair of precharge PMOS transistors is configured to pull up a voltage at a gate of sixth PMOS transistor and a gate of the third NMOS transistor.

27. The apparatus of claim 25, further comprising:
- a second bus line in close physical proximity to the first bus line; and
- a delay element coupled to the second bus line and configured to transmit a second output signal over the second bus line.

\* \* \* \* \*